United States Patent [19]
Kazama

[11] Patent Number: 6,153,923
[45] Date of Patent: *Nov. 28, 2000

[54] SEMICONDUCTOR DEVICE

[75] Inventor: Takao Kazama, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/225,301

[22] Filed: Jan. 5, 1999

[30] Foreign Application Priority Data

Oct. 7, 1998 [JP] Japan .................................. 10-285222

[51] Int. Cl.⁷ .................................................. H01C 23/495
[52] U.S. Cl. .......................... 257/666; 257/659; 257/667; 257/787
[58] Field of Search ..................... 257/666, 667, 257/787, 655

[56] References Cited

U.S. PATENT DOCUMENTS 5,371,044  12/1994  Yoshida et al. .
5,684,327  11/1997  Nakazawa et al. .
5,926,695   7/1999  Chu et al. .
5,932,923   8/1999  Kim et al. .

FOREIGN PATENT DOCUMENTS 5-291461  11/1993  Japan .
8-46119    2/1996  Japan .
8-274234  10/1996  Japan .

Primary Examiner—Sheila V. Clark
Attorney, Agent, or Firm—Jones Volentine, LLC

[57] ABSTRACT

A semiconductor device according to the invention of the present application includes a semiconductor chip having a plurality of electrodes provided on the surface thereof, at least one inner lead fixed to the surface of the semiconductor chip with an insulating layer interposed therebetween, a shielding plate placed in the neighborhood of a first side of the semiconductor chip, and a sealing resin for sealing the semiconductor chip, the inner lead and the shielding plate. The sealing resin is injected from the direction of a second side of the semiconductor chip, which is opposite to the first side of the semiconductor chip Therefore, the flow of the resin is controlled upon sealing so that the resin is uniformly injected.

10 Claims, 6 Drawing Sheets

SEMICONDUCTOR DEVICE

BACKGROUND OF THE INVENTION

1. Field of the Invention

This invention relates to a plastic-molded type semiconductor device and a method of manufacturing the semiconductor device, and particularly to an LOC (Lead On Chip) type semiconductor device and a method of manufacturing the semiconductor device.

2. Description of the Related Art

There has recently been a tendency that a semiconductor device increases in size to include or hold many functions within one element or chip. Contrary to this, there has been a demand for a reduction in its size due to the background of high-density implementations of electrical appliances as trends in semiconductor package.

As a result, a large-sized device must be held in the semiconductor package. In view of its situation, an LOC (Lead On Chip) package has been proposed.

The LOC package shows a technique for fixing leads to the surface of a device with a thermoplastic insulating double-sided adhesive tape interposed therebetween, electrically connecting the leads and electrodes provided on the surface of the device to one another and sealing the device and the leads with a resin.

As such a technique, there is known one disclosed in Japanese Patent Application Laid-Open No. Hei 8-274234, for example.

SUMMARY OF THE INVENTION

With the foregoing in view, it is therefore an object of this invention to provide a semiconductor device capable of controlling the flow of a resin upon resin sealing and restraining the generation of resin non-injected portions.

According to one aspect of this invention, for achieving the above object, there is provided a semiconductor device, comprising:

- a semiconductor chip having a plurality of electrodes provided on the surface thereof;
- an inner lead fixed to the surface of the semiconductor chip with an insulating layer interposed therebetween;
- a shielding plate placed in the neighborhood of a first side of the semiconductor chip; and
- a sealing resin for sealing the semiconductor chip, the inner lead and the shielding plate,
- the sealing resin being injected from the direction of a second side of the semiconductor chip, which is opposite to the first side of the semiconductor chip.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the invention of the present application will hereinafter be described with reference to the accompanying drawings.

Figure 1:
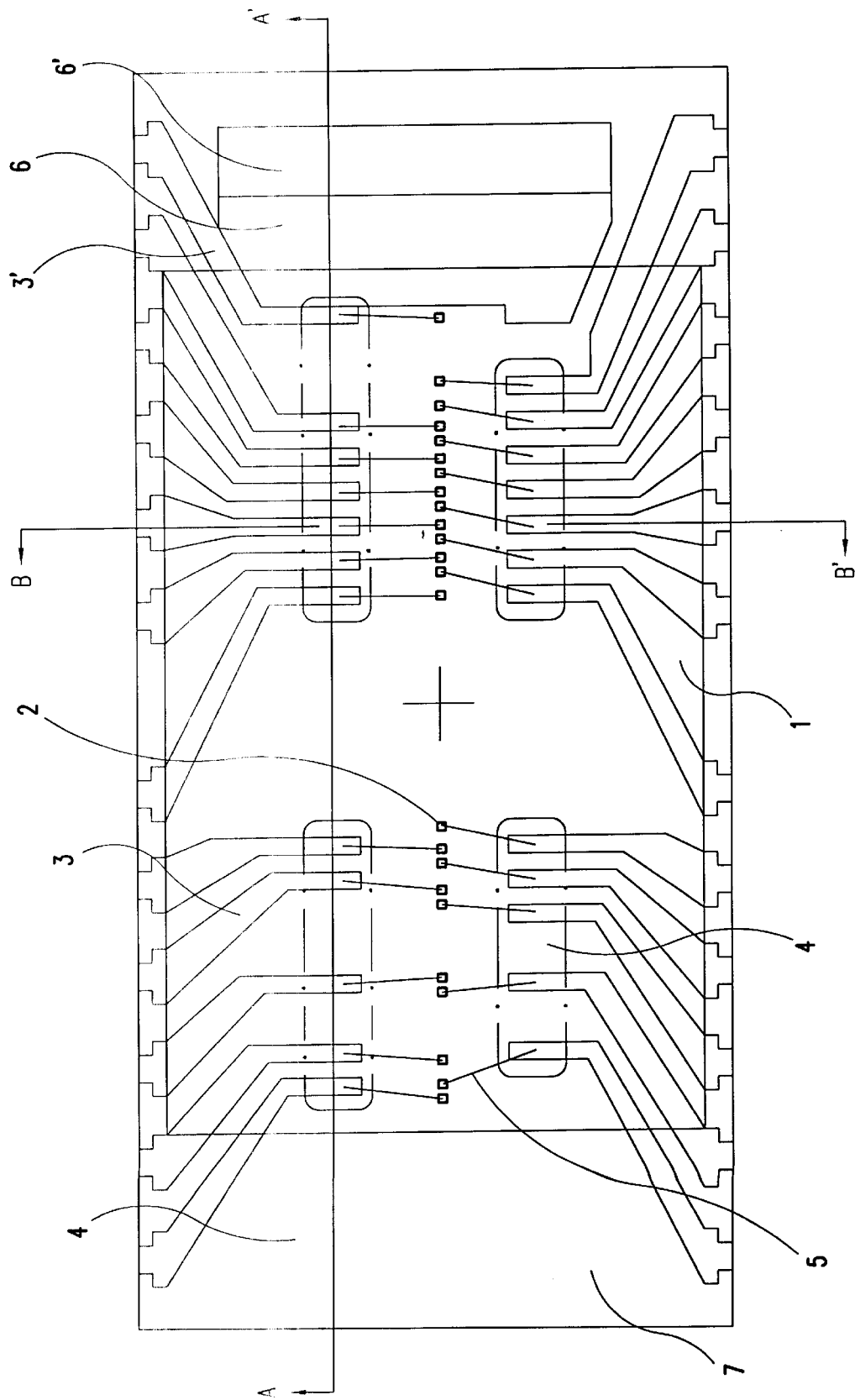
FIG. 1 is a top view showing a first embodiment of the present invention.
Figure 2:
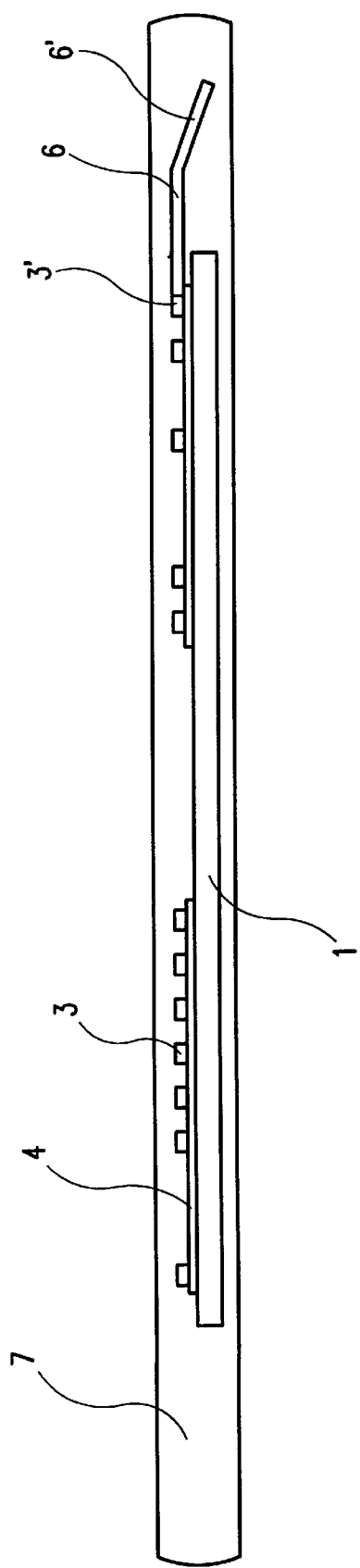
FIG. 2 is a cross-sectional view taken along line A–A' of the first embodiment of the present invention.
Figure 3:
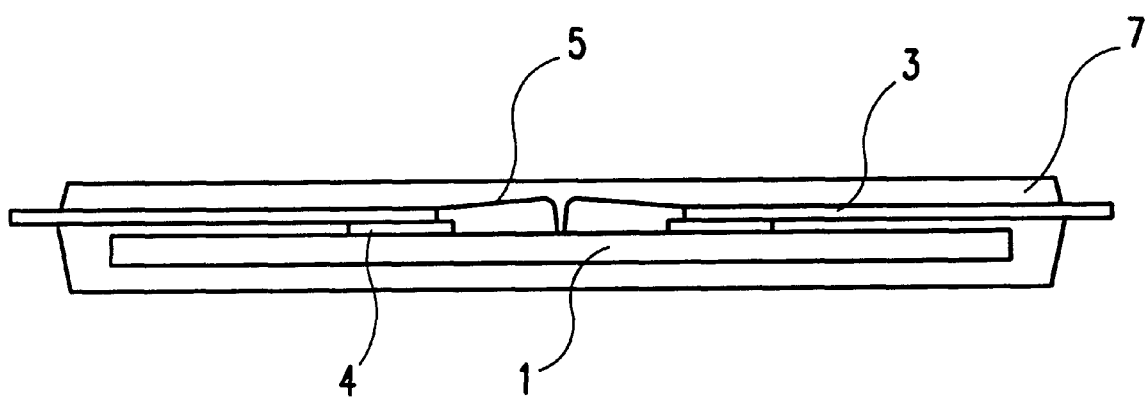
FIG. 3 is a cross-sectional view taken along line B–B' of the first embodiment of the present invention.
Figure 4:
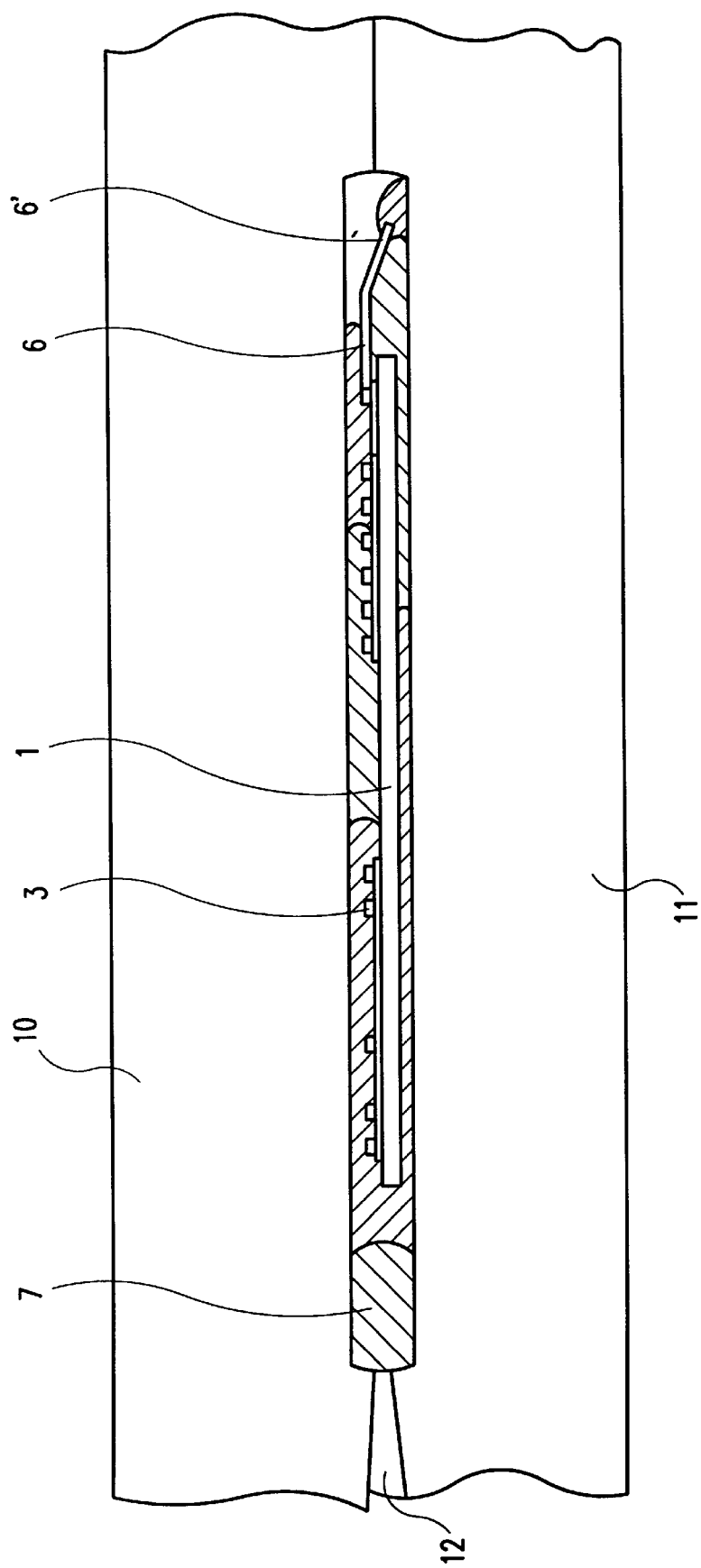
FIG. 4 is a view for describing the flow of a resin employed in the first embodiment of the present invention.

FIG. 1 is a top view of a semiconductor device according to a first embodiment of the present invention, FIG. 2 is a cross-sectional view taken along line A–A' of FIG. 1, FIG. 3 is a cross-sectional view taken along line B–B' of FIG. 1, and FIG. 4 is a view showing the state of injection of a resin, respectively.

A plurality of electrodes 2 are formed on a semiconductor element or chip 1. Inner leads 3 are fixed onto the surface of the semiconductor chip 1 by insulating tapes 4. A polyimide tape or the like whose obverse and reverse sides are coated with an adhesive, is used as the insulating tapes. The leading ends of the inner leads 3 and the electrodes 2 are respectively electrically connected to one another by conductive wires 5. For example, gold wires are used as the conductor wires.

A shielding plate 6 is connected to the outermost inner lead 3'. An inclined portion 6' bent toward the lower surface side of the semiconductor chip 1 is attached to the shielding plate 6. These semiconductor chip 1, inner leads 3, 3' and shielding plate 6 are sealed with a resin 7.

This resin injection will be explained with reference to FIG. 4. The semiconductor device is fixed by a mold upper die 10 and a mold lower die 11 with being interposed therebetween. The resin is injected into a space interposed between the upper and lower dies through a gate 12. The gate 12 is defined in the lower die 11. The injected resin 7 reaches the semiconductor chip 1. Thereafter, the resin 7 divides or branches into the upper and lower surfaces of the semiconductor chip 1 and is forwarded in its injection.

Since, at this time, the inner leads 3 exist on the upper surface of the semiconductor chip 1, they build up or increase resistance so that the velocity of flow of the resin slows down. Therefore, the resin 7 is injected into the lower surface ahead of the upper surface. In the present embodiment, the shielding plate 6 is provided on the side opposite to the side where the gate 12 is provided. Therefore, when the resin 7 which has flown through the lower surface of the semiconductor chip 1, reaches the shielding plate 6, a flow channel thereof becomes narrow and hence the velocity of injection of the resin into the upper surface of the semiconductor chip 1 increases subsequently.

Since the shielding plate 6 is provided in this way, the resin injection velocity at the resin sealing can be finally made uniform at the upper and lower portions of the semiconductor chip and hence the generation of voids on the upper surface side of the semiconductor chip can be reduced.

Further, since the inclined portion 6' is attached to the shielding plate 6, the resin is slow in its injection velocity with the inclined portion 6' as a boundary. Thus, the final velocities of the resin flowing through the upper surface side of the semiconductor chip and the resin flowing through the lower surface side thereof can be adjusted finer.

A second embodiment of the present invention will next be described with reference to FIGS. 5 and 6.

Figure 5:
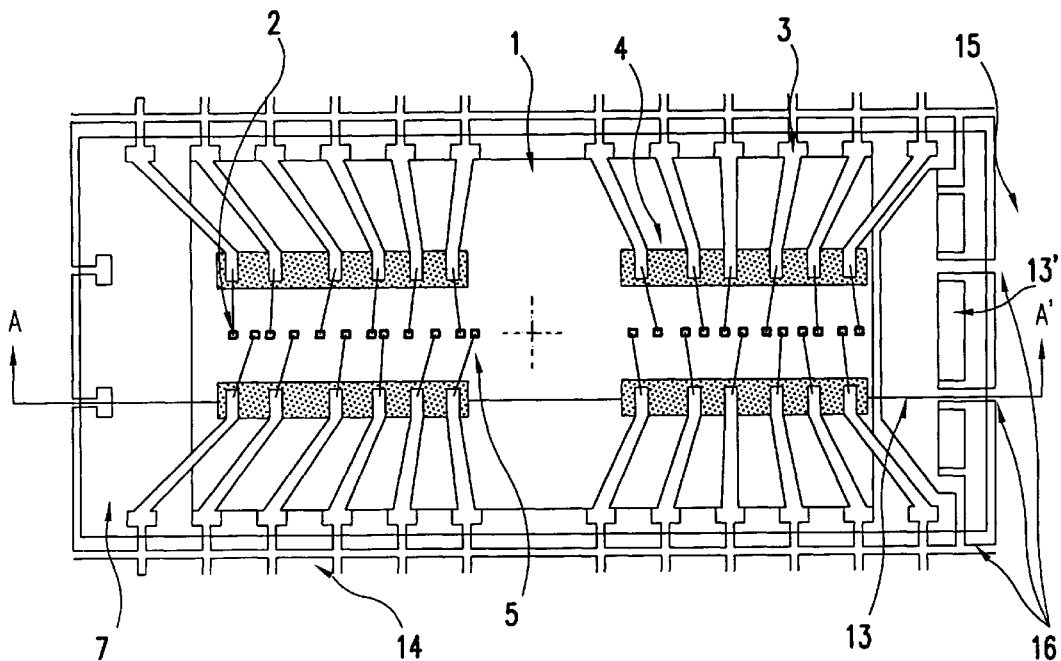
FIG. 5 is a top view illustrating a second embodiment of the present invention.
Figure 6:
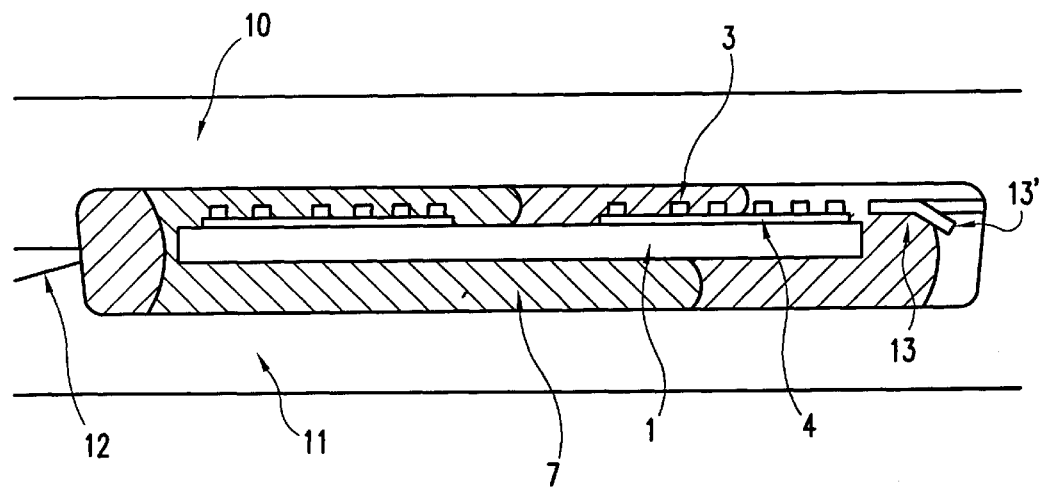
FIG. 6 is a cross-sectional view taken along line A–A' of the second embodiment of the present invention.

FIG. 5 is a view showing a semiconductor device according to the second embodiment as seen from its top, and FIG. 6 is a cross-sectional view taken along line A–A' of FIG. 5, respectively.

A plurality of electrodes 2 are formed on a semiconductor element or chip 1. Inner leads 3 are fixed onto the surface of the semiconductor chip 1 by insulating tapes 4. A polyimide tape or the like whose obverse and reverse sides are coated with an adhesive, is used as the insulating tapes. The leading ends of the inner leads 3 and the electrodes 2 are respectively electrically connected to one another by conductive wires 5. For example, gold wires are used as the conductor wires.

A shielding plate 13 is connected to a tie bar and a side rail 15 by connecting portions 16. An inclined portion 13' bent in a lower direction is attached to the shielding plate 13. After the formation of the shape of the shielding plate 13, the inclined portion 13' can be formed by press die bending.

FIG. 6 shows the manner of flow of a resin at the time that the semiconductor device constructed in this way is put into molds and the resin is injected therein.

Referring to FIG. 6, the semiconductor device is fixed by a mold upper die 10 and a mold lower die 11 with being interposed therebetween. The resin 7 is injected into a space interposed between the upper and lower dies through a gate 12. The gate 12 is defined in the lower die 11. The injected resin 7 reaches the semiconductor chip 1. Thereafter, the resin 7 branches into the upper and lower surfaces of the semiconductor chip 1 and is forwarded in its injection.

Since, at this time, the inner leads 3 exist on the upper surface of the semiconductor chip 1, they buildup or increase resistance so that the velocity of flow of the resin slows down. Therefore, the resin 7 is injected into the lower surface ahead of the upper surface. In the present embodiment, the shielding plate 13 is provided on the side opposite to the side where the gate 12 is provided. Therefore, when the resin 7 which has flown through the lower surface of the semiconductor chip 1, reaches the shielding plate 13, a flow channel thereof becomes narrow and hence the velocity of injection of the resin into the upper surface of the semiconductor chip 1 increases subsequently.

Since the shielding plate 13 is provided in this way, the resin injection velocity at the resin sealing can be finally made uniform at the upper and lower portions of the semiconductor chip and hence the generation of voids on the upper surface side of the semiconductor chip can be lessened.

Further, when the inclined portion 13' is attached to the shielding plate 13, the resin is slow in its injection velocity with the inclined portion 13' as the boundary. Thus, the final velocities of the resin flowing through the upper surface side of the semiconductor chip and the resin flowing through the lower surface side thereof can be adjusted finer.

Moreover, since the shielding plate 13 is connected to the tie bar 14 and the side rail 15, a position displacement of the shielding plate due to pressure at resin injection can be restrained.

Figure 7:
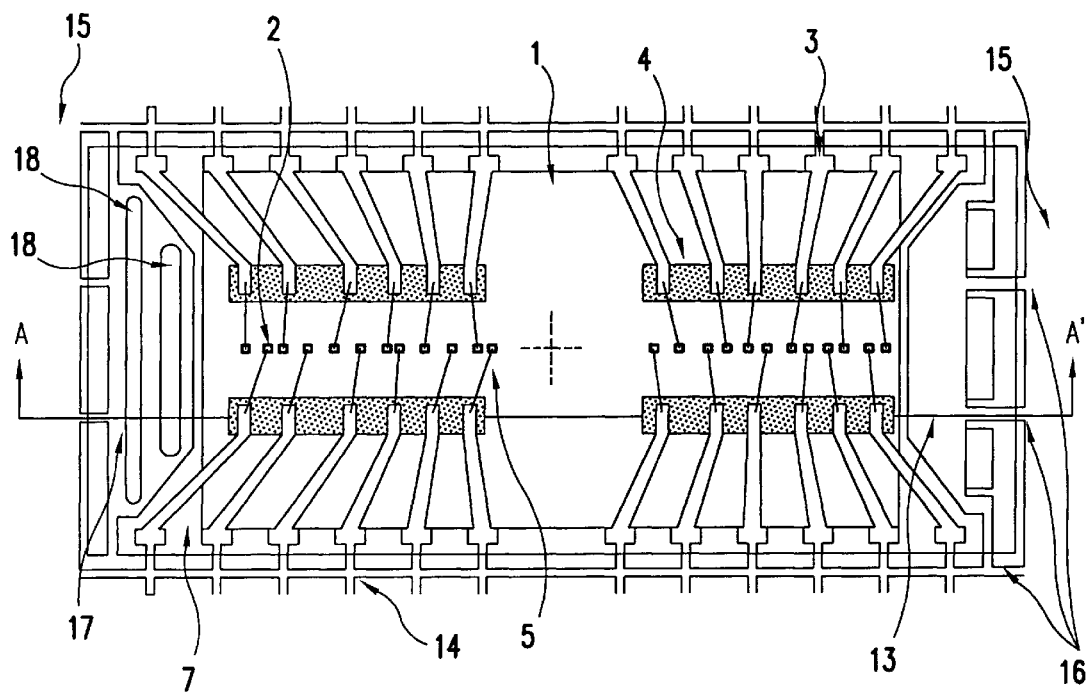
FIG. 7 is a top view showing a third embodiment of the present invention.
Figure 8:
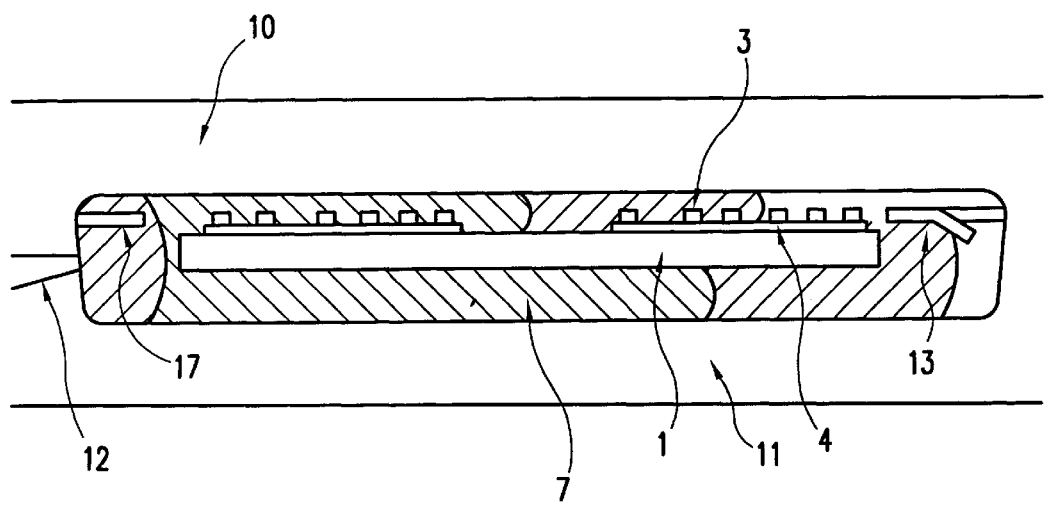
FIG. 8 is a cross-sectional view taken along line A–A' of the third embodiment of the present invention.

A third embodiment of a semiconductor device according to the invention of the present application will next be described with reference to FIG. 7 and 8. In FIGS. 7 and 8, the same elements of structure as those employed in the first and second embodiments are identified by the same reference numerals and their description will be omitted.

FIG. 7 is a top view of the semiconductor device and FIG. 8 is a cross-sectional view taken along line A–A' of FIG. 7, respectively.

In addition to the semiconductor device described in the second embodiment, the semiconductor device according to the third embodiment is provided with a second shielding plate 17 even in the neighborhood of a gate 12 as shown in FIGS. 7 and 8. The second shielding plate 17 is connected to a tie bar 14 and a side rail 15. Slits 18 are defined in the second shielding plate 17.

The flow of a resin at the time that such a semiconductor device is plastic-molded, will be explained with reference to FIG. 8.

Referring to FIG. 8, the semiconductor device is fixed by a mold upper die 10 and a mold lower die 11 with being interposed therebetween. A resin 7 is injected into a space interposed between the upper and lower dies through a gate 12. The gate 12 is defined in the lower die 11. The injected resin 7 reaches the semiconductor chip 1. Thereafter, the resin 7 divides or branches into the upper and lower surfaces of the semiconductor chip 1 and is forwarded in its injection. However, the resin 7 passes through the slits 18 of the second shielding plate 17 provided on the gate 12 side so as to be injected toward the upper surface of the semiconductor chip 1.

Since, at this time, inner leads 3 exist on the upper surface of the semiconductor chip 1, they build up or increase resistance so that the velocity of flow of the resin slows down. Therefore, the resin 7 is injected into the lower surface ahead of the upper surface. In the present embodiment, a shielding plate 13 is provided on the side opposite to the side where the gate 12 is provided. Therefore, when the resin 7 which has flown through the lower surface of the semiconductor chip 1, reaches the shielding plate 13, a flow channel thereof becomes narrow and hence the velocity of injection of the resin into the upper surface of the semiconductor chip 1 increases subsequently.

Since the shielding plate 13 is provided in this way, the resin injection velocity at the resin sealing can be finally made uniform at the upper and lower portions of the semiconductor chip and hence the generation of voids on the upper surface side of the semiconductor chip can be lessened.

Further, when an inclined portion 13' is attached to the shielding plate 13, the resin becomes slow in its injection velocity with the inclined portion 13' as the boundary. Thus, the final velocities of the resin flowing through the upper surface side of the semiconductor chip and the resin flowing through the lower surface side thereof can be adjusted finer.

Moreover, since the shielding plate 13 is connected to the tie bar 14 and the side rail 15, a position displacement of the shielding plate due to pressure at resin injection can be restrained.

In the semiconductor device having the structure wherein the leads are provided on the surface of such a semiconductor chip, the lower resin is formed thick as viewed from the leads. Therefore, this will cause thickness uniformity or the like of the upper and lower molds, so that the semiconductor chip might be warped.

According to the semiconductor device of the third embodiment, since the second shielding plate 17 is provided, it acts as a skeleton framework. It can be thus expected that a package can be prevented from warping due to a contraction in the molded resin, which is caused by the thickness uniformity or the like of the upper and lower molds in the semiconductor device.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a semiconductor chip having a plurality of electrodes provided on a surface thereof;
   an inner lead fixed to the surface of said semiconductor chip with an insulating layer interposed therebetween;
   a shielding plate placed in a neighborhood of a first side of said semiconductor chip; and
   a sealing resin for sealing said semiconductor chip, said inner lead and said shielding plate, said sealing resin being injected from a direction of a second side of said semiconductor chip, which is opposite to the first side of said semiconductor chip.

2. The semiconductor device according to claim 1, wherein said shielding plate is provided continuously from said inner lead adjacent thereto.

3. The semiconductor device according to claim 1, wherein said shielding plate includes an inclined portion bent in a direction toward a back of said semiconductor chip.

4. A semiconductor device, comprising:
   a semiconductor chip having a plurality of electrodes provided on a surface thereof;
   a plurality of inner leads electrically connected to said plurality of electrodes respectively;
   a shielding plate lying within a surface substantially identical to a surface on which said inner leads are placed, and disposed in a neighborhood of a first side of said semiconductor chip; and
   a sealing resin for sealing said semiconductor chip, said inner leads and said shielding plate,
   said sealing resin being injected from a direction of a second side of said semiconductor chip, which is opposite to the first side of said semiconductor chip.

5. A semiconductor device, comprising:
   a semiconductor chip having a plurality of electrodes formed on an obverse side thereof;
   a plurality of first inner leads fixed to a surface of said semiconductor chip with an insulating material interposed therebetween and electrically connected to said plurality of electrodes respectively;
   a sealing resin for sealing the obverse side and a reverse side of said semiconductor chip; and
   at least one second inner lead provided between the sealing resin for sealing the obverse side and sealing the reverse side, said at least one second inner lead being electrically disconnected from said plurality of electrodes,
   said at least one second inner lead being provided in a neighborhood of said plurality of first inner leads farthest from an injection hole for said sealing resin.

6. The semiconductor device according to claim 5, wherein said at least one second inner lead is wider than said plurality of first inner leads adjacent thereto.

7. The semiconductor device according to claim 5, wherein said at least one second inner lead is disposed on a surface substantially identical to that for said plurality of first inner leads.

8. A semiconductor device formed so as to be clamped by upper and lower molds and sealed with a resin injected from a first side of said molds, comprising:
   a semiconductor chip having a plurality of electrodes provided on a surface thereof;
   a plurality of inner leads fixed to the surface of said semiconductor chip with an insulating layer interposed therebetween and respectively electrically connected to said plurality of electrodes; and
   a shielding plate provided on a second side opposite to said first side and electrically disconnected from said plurality of electrodes.

9. The semiconductor device according to claim 8, wherein said shielding plate has a first portion substantially parallel to the surface of said semiconductor chip and a second portion continuous and bent from said first portion.

10. The semiconductor device according to claim 8, wherein said semiconductor chip further includes a second shielding plate provided in a neighborhood of said first side.

* * * * *